United States Patent [19]
Park

[11] Patent Number: 5,932,915
[45] Date of Patent: Aug. 3, 1999

[54] ELECTRO STATIC DISCHARGE PROTECTING CIRCUIT WITH AN INNER CIRCUIT PROTECTION MECHANISM

[75] Inventor: Yong Park, Kyungki-do, Rep. of Korea

[73] Assignee: LG Semicon Co., Ltd., Chungcheongbuk-do, Rep. of Korea

[21] Appl. No.: 08/931,716

[22] Filed: Sep. 16, 1997

[30] Foreign Application Priority Data

Jun. 2, 1997 [KR] Rep. of Korea ............. 97-22753

[51] Int. Cl.[6] .................................................. H01L 23/62
[52] U.S. Cl. .................................. 257/355; 257/361
[58] Field of Search ......................... 257/361, 362, 257/355

[56] References Cited

U.S. PATENT DOCUMENTS 5,686,751  11/1997  Wu ................................. 257/360

Primary Examiner—David B. Hardy

[57] ABSTRACT

An electro static discharge (ESD)-protecting circuit includes a semiconductor substrate of a first conductivity type, a well of a second conductivity type formed within the semiconductor substrate, a first impurity diffusion region of the first conductivity type formed in the well, second and third impurity diffusion regions of the second conductivity type spaced apart from the first impurity diffusion region in the well, an input port connected to the first impurity diffusion region, and a ground port connected to the third impurity diffusion region.

15 Claims, 1 Drawing Sheet

ELECTRO STATIC DISCHARGE PROTECTING CIRCUIT WITH AN INNER CIRCUIT PROTECTION MECHANISM

BACKGROUND OF THE INVENTION

1. Field of the Invention

The present invention relates to a semiconductor device and, more particularly, to an electro static discharge (hereinafter referred to as ESD)-protecting circuit.

2. Discussion of the Related Art

A conventional ESD-protecting circuit will be described with reference to the accompanying drawings.

FIG. 1 is a cross-sectional view showing a structure of a conventional ESD-protecting circuit which includes a p-type well 12 having a predetermined depth beneath a surface of a semiconductor substrate 11, first and second impurity diffusion regions 13 and 14 of n-type spaced apart from each other beneath the top surface of the semiconductor substrate 11, and a third impurity diffusion region 15 of p-type spaced apart from the second impurity diffusion region 14 of n-type and formed beneath top surface of the p-type well 12.

An input port Vin is connected to the first impurity diffusion region 13 of n-type, an ground port GND is connected to the second impurity diffusion region 14 of n-type, and a bias voltage Vp catching a bias of the p-well 12 is connected to the third impurity diffusion region 15. Though not shown in the figure, the ground port GND connected to the second impurity diffusion region 14 is also connected to an inner circuit.

The operation of an ESD-protecting circuit having the aforementioned structure is achieved by a punch-through generated between the input port Vin and the ground port GND when static electricity is applied to the input port Vin. In case that a plus static electricity is applied to a conventional ESD-protecting circuit, a significant inverse bias is caught between the input port Vin and the p-well 12 and a forward bias flows between the p-well 12 and the ground port GND. Thus, the operation of the circuit is achieved by the punch-through between the input port Vin and the ground port GND.

On the contrary, in case a minus static electricity is applied to the conventional ESD-protecting circuit, forward currents flow between the input port Vin and the ground port GND, but a PN junction is not destroyed.

However, the conventional ESD-protecting circuit has problems. If a strong plus static electricity is applied to it, a PN junction is destroyed, thus the inner circuit can not be protected.

SUMMARY OF THE INVENTION

Therefore, the present invention is directed to an ESD-protecting circuit that substantially obviates one or more of problems due to limitations and disadvantages of the related art.

An object of the invention is to provide an ESD-protecting circuit suitable for efficiently protecting an inner circuit from external static electricity.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, an ESD-protecting circuit includes a semiconductor substrate of a first conductivity type; a well of a second conductivity type formed beneath a surface of the semiconductor substrate; a first impurity diffusion region of the first conductivity type formed in the well; second and third impurity diffusion regions of the second conductivity type spaced apart from the first impurity diffusion region in the well; an input port connected to the first impurity diffusion region; and a ground port connected to the third impurity diffusion region.

In another aspect of the present invention, an ESD-protecting circuit includes a semiconductor substrate of a first conductivity type; a well of a second conductivity type formed beneath a surface of the semiconductor substrate; a first impurity diffusion region of the first conductivity type formed in the well; second and third impurity diffusion regions of the second conductivity type spaced apart from the first impurity diffusion region by a predetermined distance; a gate formed over the semiconductor substrate at the second impurity region; an input port connected to the first impurity diffusion region; and a ground port connected to either the third impurity diffusion region or the gate.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
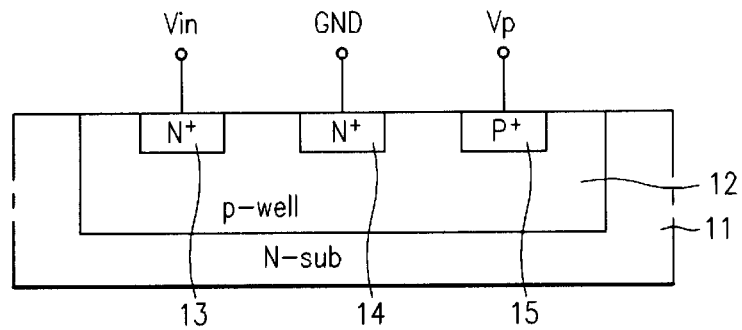
FIG. 1 is a cross-sectional view showing a structure of a conventional ESD protecting circuit.
Figure 2:
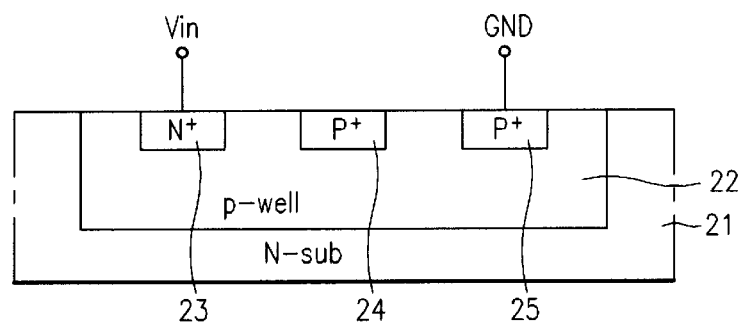
FIG. 2 is a cross-sectional view showing a structure of an ESD-protecting circuit according to a preferred embodiment of the present invention.

FIG. 2 is a cross-sectional view showing a structure of an ESD-protecting circuit according to a preferred embodiment of the present invention. As shown in FIG. 2, the ESD-protecting circuit includes a p-well 22 formed to have a predetermined depth from a surface of a semiconductor substrate 21 of n-type, a first impurity diffusion region 23 of n-type formed in a predetermined area of the p-well 22, and second and third impurity diffusion regions 24 and 25 of p-type in predetermined areas of the p-well 22. An input port Vin, to which external static electricity is applied, is connected to the first impurity diffusion region 23 of n-type, and a ground port GND is connected to the third impurity diffusion region 25 of p-type. The second impurity diffusion region 24 of p-type is a floating ground region functioning as a potential wall. The ground port GND is connected to an inner circuit.

Figure 3:
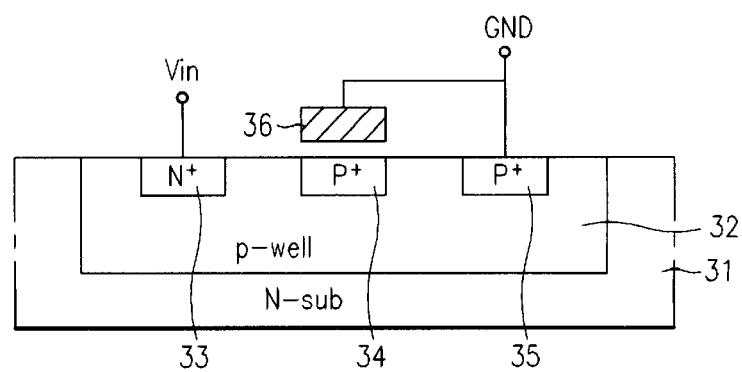
FIG. 3 is a cross-sectional view showing a structure of an ESD-protecting circuit according to another preferred embodiment of the present invention.

FIG. 3 is a cross-sectional view showing a structure of an ESD-protecting circuit according to another embodiment of the present invention. As shown in FIG. 3, the ESD-protecting circuit includes a p-well 32 formed beneath a surface of a semiconductor substrate 31 of n-type to have a predetermined depth, a first impurity diffusion region 33 of n-type formed at a predetermined area of the p-well 32, second and third impurity diffusion regions 34 and 35 of p-type spaced apart from the first impurity diffusion region 33 of n-type and formed under at predetermined areas of the p-well 32, and a gate 36 made of either polysilicon or metal and formed over the second impurity diffusion region 34 of p-type.

An input port Vin, to which external static electricity is applied, is connected to the first impurity diffusion region 33 of n-type, and a ground port GND is connected to the gate 36 and the third impurity diffusion region 35 of p-type.

On the other hand, the gate 36, not connected to the second impurity diffusion region 34 of p-type, is formed over the semiconductor substrate 31 at placement of the the second impurity diffusion region 34 of p-type. Thus, the gate 36 can be used as a floating ground region functioning as a potential wall. The ground port GND is connected to an inner circuit even though not shown in the figure.

The operation of the ESD-protecting circuit of FIGS. 2 and 3 according to the preferred embodiments of the present invention will be described. If a plus static electricity is applied to the input port Vin, potential of static electricity decreases because a long discharge path is established in the ESD-protection circuit. For example, a discharge path, such as "the first impurity diffusion region 23 the p-well 22, the second impurity diffusion region 24 the p-well 22—the third impurity diffusion region 25", or "the first impurity diffusion region 33 of n-type-the p-well 32—the second impurity diffusion region 34 of p-type-the p-well 32—the third impurity diffusion region 35 of p-type". Besides, a mobile potential wall is formed due to the p region of the floating ground region, thereby efficiently protecting the inner circuit from a significant static electricity.

If a minus static electricity is applied, it has characteristics of forward direction between the input port Vin and the ground port GND, thereby obtaining good protecting characteristics.

The ESD-protecting circuit of the present invention has the advantages including the following. Since a floating ground region is formed between a p-type impurity diffusion region and an n-type impurity diffusion region where the input port and the ground port are connected, a mobile potential wall is formed to efficiently protect the inner circuit from external static electricity.

It will be apparent to those skilled in the art that various modifications and variations can be made in the ESD-protecting circuit of the present invention without departing from the spirit or scope of the inventions. Thus, it is intended that the present invention cover the modifications and variations of this invention provided they come within the scope of the appended claims and their equivalents.

What is claimed is:

1. An electro static discharge (ESD)-protecting circuit comprising:
    a semiconductor substrate of a first conductivity type;
    a well of a second conductivity type formed within the semiconductor substrate;
    a first impurity diffusion region of the first conductivity type formed in the well;
    second and third impurity diffusion regions of the second conductivity type spaced apart from the first impurity diffusion region in the well;
    an input port connected to the first impurity diffusion region; and
    a ground port connected to the third impurity diffusion region,
        wherein the second impurity diffusion region is a floating ground region operating as a potential wall.

2. The circuit as claimed in claim 1, wherein the first conductivity type is an n-type and the second conductivity type is a p-type.

3. The circuit as claimed in claim 1, wherein the second impurity diffusion region is formed between the first impurity diffusion region and the third impurity diffusion region.

4. The circuit as claimed in claim 1, wherein if a plus static electricity is applied to the input port, a discharge path is established, the discharge path extending from the first impurity diffusion region to the well, then to the second impurity diffusion region, then to the well, and then to the third impurity diffusion region, and the second impurity diffusion region forms a mobile potential wall.

5. The circuit as claimed in claim 1, wherein a static electricity is applied to the input port.

6. An electro static discharge (ESD)-protecting device comprising:
    a semiconductor substrate of a first conductivity type;
    a well of a second conductivity type formed within the semiconductor substrate;
    a first impurity diffusion region of the first conductivity type formed in the well;
    second and third impurity diffusion regions of the second conductivity type spaced apart from the first impurity diffusion region;
    a gate formed over the semiconductor substrate and the second impurity region;
    an input port connected to the first impurity diffusion region; and
    a ground port connected to either the third impurity region or the gate.

7. The device as claimed in claim 6, wherein the first conductivity type is an n-type and the second conductivity type is a p-type.

8. The device as claimed in claim 6, wherein the ground port is connected to the gate and the third impurity diffusion region.

9. The device as claimed in claim 6, wherein the gate is made of either polysilicon or metal.

10. The device as claimed in claim 6, wherein if a plus static electricity is applied to the input port, a discharge path is established, the discharge path extending from the first impurity diffusion region to the well, then to the second impurity diffusion region, then to the gate, then to the well, and then to the third impurity diffusion region, and the second impurity diffusion region forms a mobile potential wall.

11. The device as claimed in claim 6, wherein a static electricity is applied to the input port.

12. An electro static discharge (ESD)-protecting device comprising:
    a semiconductor substrate of a first conductivity type;
    a well of a second conductivity type formed within the semiconductor substrate;
    a first impurity diffusion region of the first conductivity type formed in the well;
    second and third impurity diffusion regions of the second conductivity type spaced apart from the first impurity diffusion region in the well;

an input port connected to the first impurity diffusion region; and a ground port connected to the third impurity diffusion region, wherein the second impurity diffusion region is formed between the first impurity diffusion region and the third impurity diffusion region.

13. The device as claimed in claim 12, wherein the first conductivity type is an n-type and the second conductivity type is a p-type.

14. The device as claimed in claim 12, wherein if a plus static electricity is applied to the input port, a discharge path is established, the discharge path extending from the first impurity diffusion region to the well, then to the second impurity diffusion region, then to the well, and then to the third impurity diffusion region, and the second impurity diffusion region forms a mobile potential wall.

15. The device as claimed in claim 12, wherein a static electricity is applied to the input port.

* * * * *